United States Patent
Kurita

(10) Patent No.: US 8,278,143 B2
(45) Date of Patent: *Oct. 2, 2012

(54) MANUFACTURING METHOD FOR ELECTRONIC DEVICES

(75) Inventor: Yoichiro Kurita, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/067,723

(22) Filed: Jun. 22, 2011

(65) Prior Publication Data

US 2011/0253767 A1 Oct. 20, 2011

Related U.S. Application Data

(63) Continuation of application No. 12/805,048, filed on Jul. 8, 2010, now Pat. No. 7,977,158, which is a continuation of application No. 12/292,378, filed on Nov. 18, 2008, now Pat. No. 7,772,032.

(30) Foreign Application Priority Data

Nov. 28, 2007 (JP) ................................ 2007/306864

(51) Int. Cl.
*H01L 21/60* (2006.01)
*H01L 21/603* (2006.01)

(52) U.S. Cl. ........ 438/107; 438/109; 438/615; 257/686; 257/E21.51; 257/E21.515; 257/E21.519; 228/175; 228/193; 228/203; 228/212

(58) Field of Classification Search .................. 438/107, 438/108, 109, 122, 126, 615; 257/686, E21.51, 257/E21.515, E21.519; 228/141.1, 175, 228/193, 203, 212

See application file for complete search history.

(56) References Cited

U.S. PATENT DOCUMENTS 4,808,769 A 2/1989 Nakano et al.
5,528,462 A 6/1996 Pendse
(Continued)

FOREIGN PATENT DOCUMENTS

JP 7-297227 A 11/1995
(Continued)

OTHER PUBLICATIONS

Notification of Reasons for Refusal dated Feb. 7, 2012 (with an English translation).

*Primary Examiner* — Mary Wilczewski
(74) *Attorney, Agent, or Firm* — McGinn IP Law Group, PLLC

(57) ABSTRACT

A manufacturing method for an electronic device joining a first metallic bond part formed on a first electronic component and a second metallic bond part formed on a second electronic component includes a first process for placing the first metallic bond part directly against the second metallic bond part, applying pressure to the first electronic component and the second electronic component, joining the first metallic bond part to the second metallic bond part with solid-phase diffusion, and releasing the applied pressure, and a second process for heating the first electronic component and the second electronic component at a predetermined temperature such that the first metallic bond part and the second metallic bond part are joined together by melting at least one of the first metallic bond part and the second metallic bond part.

27 Claims, 11 Drawing Sheets

U.S. PATENT DOCUMENTS

| | | |
|---|---|---|
| 6,583,514 B2 | 6/2003 | Tago et al. |
| 6,803,253 B2 | 10/2004 | Tago et al. |
| 6,955,982 B2 | 10/2005 | Jimarez et al. |
| 7,220,622 B2 | 5/2007 | Jadhav et al. |
| 7,368,322 B2 | 5/2008 | Reiss et al. |
| 7,534,715 B2 | 5/2009 | Jadhav et al. |
| 7,547,625 B2 | 6/2009 | Beyne et al. |
| 7,562,428 B2 | 7/2009 | Shinkai |
| 7,772,032 B2 * | 8/2010 | Kurita ............. 438/107 |
| 7,880,315 B2 | 2/2011 | Beyne et al. |
| 7,977,158 B2 * | 7/2011 | Kurita ............. 438/107 |
| 2002/0163075 A1 | 11/2002 | Ho et al. |
| 2003/0009876 A1 | 1/2003 | Yamauchi |
| 2004/0253803 A1 | 12/2004 | Tomono et al. |
| 2005/0224953 A1 | 10/2005 | Lee et al. |
| 2005/0284863 A1 | 12/2005 | DeBonis |
| 2006/0063310 A1 | 3/2006 | Jadhav et al. |
| 2006/0087020 A1 | 4/2006 | Hirano et al. |
| 2007/0216023 A1 | 9/2007 | Nakatani et al. |
| 2007/0261233 A1 | 11/2007 | Kira et al. |
| 2008/0099904 A1 | 5/2008 | Chou et al. |
| 2009/0051023 A1 | 2/2009 | Nam et al. |
| 2009/0078746 A1 | 3/2009 | Karashima et al. |
| 2009/0108429 A1 | 4/2009 | Tsao et al. |
| 2009/0137082 A1 | 5/2009 | Kurita |
| 2009/0229120 A1 | 9/2009 | Taniguchi et al. |

FOREIGN PATENT DOCUMENTS

| | | |
|---|---|---|
| JP | 10-112476 A | 4/1998 |
| JP | 2002-110726 A | 4/2002 |
| JP | 2002-111191 | 4/2002 |
| JP | 2002-170919 A | 6/2002 |
| JP | 2003-249620 A | 9/2003 |
| JP | 2003-282819 | 10/2003 |
| JP | 2004-79685 | 3/2004 |

* cited by examiner

MANUFACTURING METHOD FOR ELECTRONIC DEVICES

The present application is a Continuation Application of U.S. patent application Ser. No. 12/805,048, filed on Jul. 8, 2010 now U.S. Pat. No. 7,977,158, which is a Continuation Application of U.S. patent application Ser. No. 12/292,378, filed on Nov. 18, 2008, now U.S. Pat. No. 7,772,032, which is based on and claims priority from Japanese patent application No. 2007-306864, filed on Nov. 28, 2007, the entire contents of which are incorporated herein by reference.

BACKGROUND OF THE INVENTION

1. Field of the Invention

The present invention relates to a method for manufacturing electronic devices.

2. Description of Related Art

A variety of methods has been developed for joining semiconductor chips together, semiconductor substrates together, and semiconductor chips and boards. JP-A-2002-111191 discloses the following process as a method for joining electronic components to a board.

Ball solder is placed on the electrodes of the electronic component. The ball solder is for example, tin (Sn) with a silver (Ag) content of 3.5 percent by weight. Chromium (Cr), nickel (Ni), and gold (Au) are next metalized onto the board electrodes. The electronic component electrodes are aligned to match the board electrodes, and the ball solder heated below the melting point and pressure applied to make a temporary clamp. The ball solder is next heated to approximately 250 degrees Celsius to melt the ball solder within the metalized elements (permanent clamp). In this case, the position deviation between the electronic components and board is corrected by a self-alignment effect rendered by the surface tension of the ball solder.

JP-A-2004-79685 discloses a method for joining the chip to the semiconductor substrate. In this method, flux is coated onto the solder bumps formed on the semiconductor substrate. After that, the semiconductor substrate and chips are positioned opposite each other, and then temporarily clamped by the flux. The chip is then joined to the semiconductor substrate by heating (permanent clamp or main clamp). During heating, the semiconductor substrate and the chip are essentially rendered a non-load. Consequently the chip can change its position on the semiconductor substrate (self-alignment).

Moreover, JP-A-2003-282819 discloses a method for joining multiple semiconductor chips in one batch after laminating and positioning the multiple semiconductor chips. For joining multiple semiconductor chips in one batch, heating in a reflow process or heating and applying pressure with a bonding tool are utilized.

The following analyses are given by the present invention.

In JP-A-2002-111191 and JP-A-2004-79685, when the self-alignment effect corrects displacements between the electronic component (or chip) and the board during the permanent clamping, no load is applied to the board and electronic component (or chip). This means that there are no fixed electronic component (or chip) and board positions.

Therefore, when using the method of JP-A-2002-111191 and JP-A-2004-79685 with thin boards or electronic components (or chips), a warp or curvature occurs in the board or electronic component (or chip) in accordance with heat applied in the permanent clamping process. The warp causes displacements among the components (or boards) to be joined. This leads to lowering the reliability of the bond part.

The process in JP-A-2003-282819 for positioning multiple semiconductor chips is performed in a state where multiple semiconductor chips are merely stacked on each other. Because of no temporary clamp for multiple semiconductor chips, conveying the positioned semiconductor chips to other place is impossible. Therefore the bonding of the semiconductor chips must be performed at the place for positioning multiple semiconductor chips. In most cases, positioning the semiconductor chip is usually just an additional step on the semiconductor chip production line. This means that the semiconductor chip is positioned in the air. This leads the oxidization of the bond parts during the bonding. The oxidization causes lowering the reliability of the joint.

BRIEF DESCRIPTION OF THE DRAWINGS

The above and other objects, advantages and features of the present invention will be more apparent from the following description of certain preferred mode taken in conjunction with the accompanying drawings in which.

SUMMARY

This invention provides a method for manufacturing an electronic device including a first electronic component and a second electronic component, and a metallic bond part for the first electronic component bonded to a metallic bond part for the second electronic component; and including a first process for:

placing the bond part for the first electronic component directly against the bond part for the second electronic component;

applying pressure to the first electronic component and the second electronic component;

metallically joining the bond part of the first electronic component to the bond part of the second electronic component; and releasing the applied pressure, and a second process for:

clamping the joined first electronic component and second electronic component with a clamping member; and heating the first electronic component and the second electronic component and maintaining a specified temperature to weld (solder) the metallically joined bond parts together.

In this invention, the first process metallically joins the bond part of the first electronic component to the bond part of the second electronic component. Moreover, the second process utilizes a clamping member to clamp the joined first electronic component to the second electronic component, and heats the first electronic component and the second electronic component maintaining a specified temperature. The first electronic component and the second electronic component can be securely joined by temporarily clamping the first electronic component and the second electronic component in the first process, and then heating the first electronic component and second electronic component in the second process.

Moreover, during the heating in the second process, a clamping member clamps the relative positions of the first electronic component and the second electronic component. Utilizing the clamping member to clamp the first electronic component and the second electronic component in this second process that requires heating, serves to suppress the displacements that occur between the first electronic component and the second electronic component as the first electronic component and the second electronic component are heated. Moreover, using the clamping member to clamp the first electronic component and the second electronic component makes the first electronic component and the second electronic component less prone to deform or in other words warp due to heating.

The bonding reliability between the electronic components can in this way be improved.

DETAILED DESCRIPTION OF THE PREFERRED EMBODIMENTS

The invention will be now described herein with reference to the illustrative embodiments. Those skilled in the art will recognize that many alternative embodiments can be accomplished using the teachings of the present invention and that the invention is not limited to the embodiments illustrated for explanatory purposes.

Figure 1A:
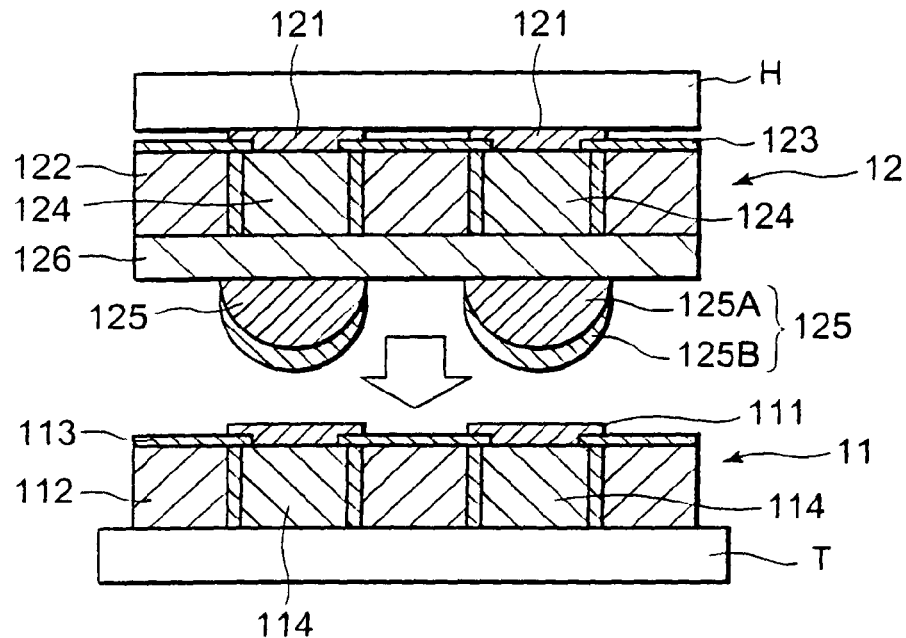
FIG. 1A is a drawing showing the process for manufacturing the electronic device of the first embodiment of this invention.
Figure 1B:
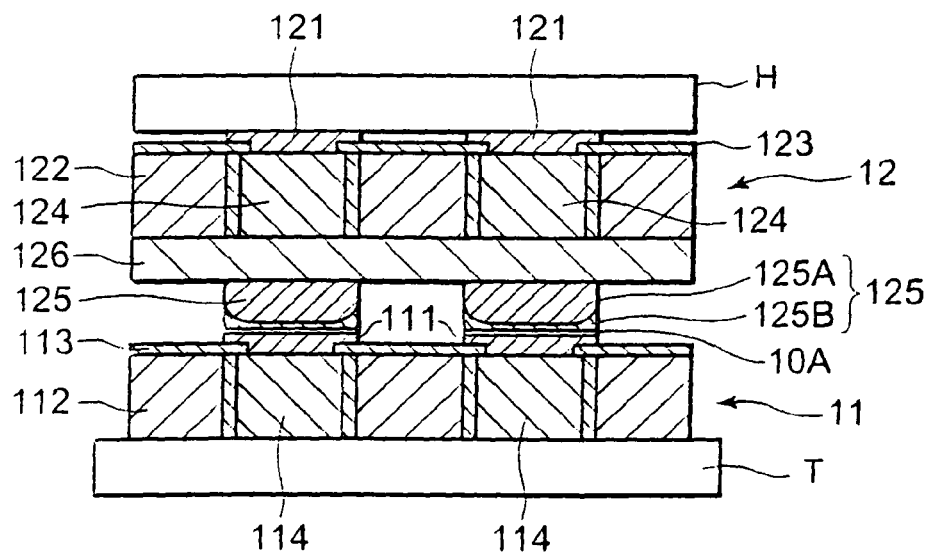
FIG. 1B is a drawing showing the process for manufacturing the electronic device of the first embodiment of this invention.
Figure 2:
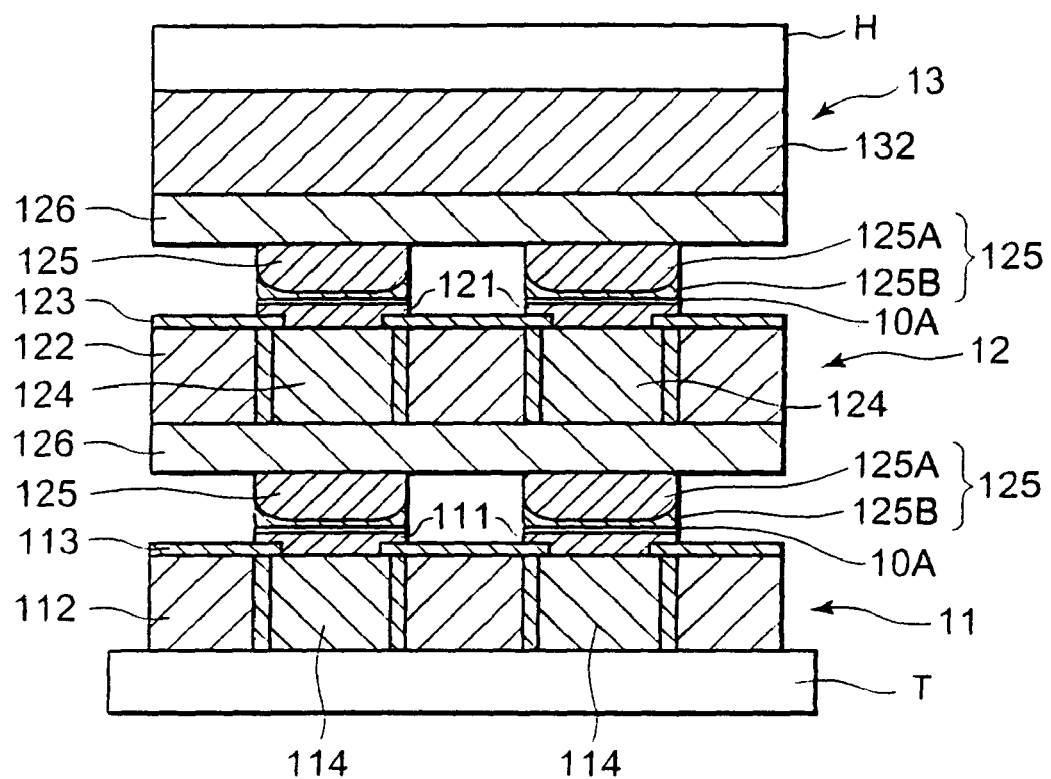
FIG. 2 is a drawing showing the process for manufacturing the electronic device.
Figure 3:
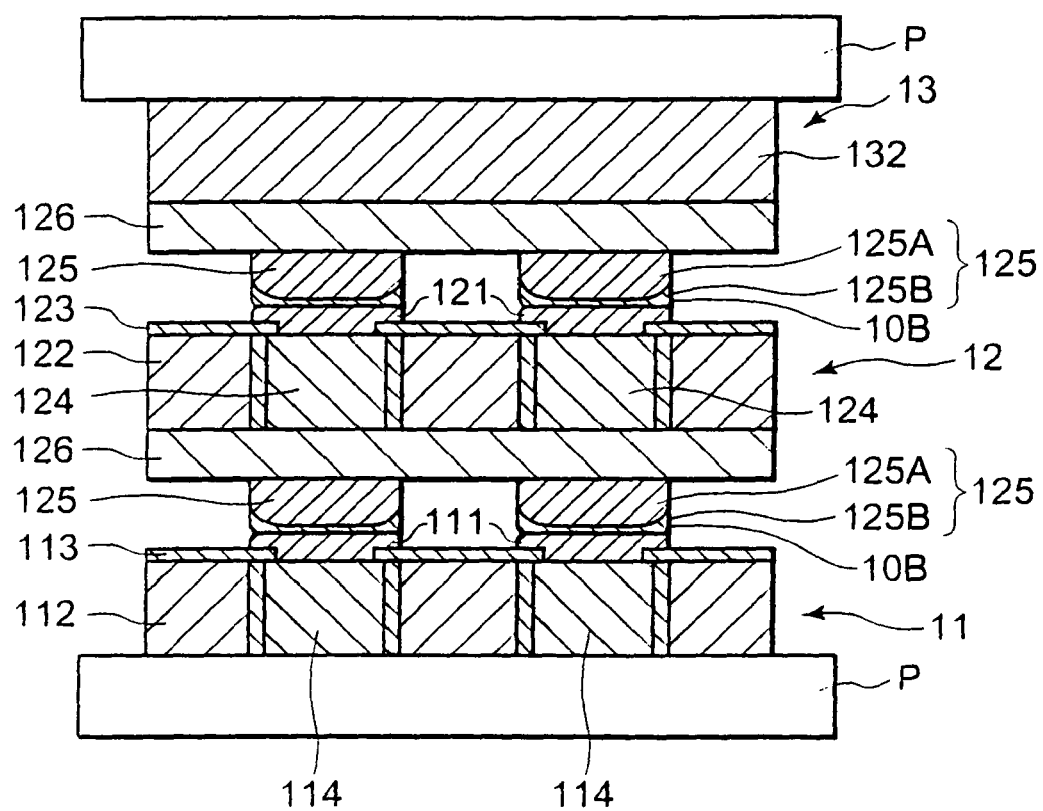
FIG. 3 is a drawing showing the process for manufacturing the electronic device.

Referring now to FIGS. 1 to 3, a method for manufacturing an electron device according to a first embodiment of the present invention will be described.

The embodiments of this invention will be described next while referring to the drawings. The same reference numerals are assigned to common structural elements in all drawings and their description is omitted for purposes of convenience.

First Embodiment

The first embodiment of this invention is described next while referring to FIGS. 1 to 3.

The method for manufacturing an electronic device in this embodiment includes a first electronic component 11 and a second electronic component 12, and joins a bond part 111 of the first electronic component 11 to the bond part 125 of the second electronic component 12.

The method for manufacturing electronic devices in this embodiment further includes a first process for: placing the bond part 111 of the first electronic component 11 directly against the bond part 125 of the second electronic component 12, and applying pressure to the first electronic component 11 and the second electronic component 12, and releasing the pressure on the first electronic component 11 and the second electronic component 12 after metallically joining the bond parts 111, 125 together; and a second process for: then clamping the relative positions of the joined first electronic component 11 and second electronic component 12 with a clamping member P, and heating the first electronic component 11 and the second electronic component 12 and maintaining a specified temperature to weld the metallically joined bond parts together.

The method for manufacturing an electronic device in this embodiment is next described in detail.

As shown in FIG. 1A, a first semiconductor chip 11 serving as the first electronic component 11 and a second semiconductor chip 12 serving as the second electronic component 12 are positioned opposite each other.

The first semiconductor chip 11 includes a semiconductor substrate 112, an insulator film 113 formed on this semiconductor substrate 112, a via hole 114 penetrating through the semiconductor substrate 112, and multiple bond parts 111.

Multiple via holes 114 are formed at a specified pitch. These via holes 114 are formed for example from a conductor such as copper, tungsten, polysilicon, or nickel.

Openings matching these via holes 114 are formed on the insulator film 113. The bond parts 111 are formed to fill these openings. These bond parts 111 are made from a metal, for example including gold, and connect to the via holes 114 by way of the opening.

The second semiconductor chip 12 contains a semiconductor substrate 122, an insulator film 123 formed on this semiconductor substrate 122, a wiring layer 126 formed on this semiconductor substrate 122, via holes 124 penetrating through the semiconductor substrate 122, multiple bond parts 121, and multiple bond parts 125. Multiple via holes 124 are installed at a specified pitch. These multiple via holes 124 are formed from a conductor such as copper, tungsten, polysilicon, or nickel.

The insulator film 123 is formed on one surface of the semiconductor substrate 122. Openings are formed on this insulator film 123 at positions matching these via holes 124. A bond part 121 is formed so as to fill the opening in this insulator film 123. These bond parts 121 are made from metal, for example including gold, and connect to the via holes 124 by way of the opening.

A wiring layer (layer including an insulating layer and wiring) 126 is formed on the other side of the semiconductor substrate 122.

Multiple bond parts 125 are formed on the semiconductor substrate 122, and connect to via holes 124 by way of the wiring layer 126. The bond part 125 is utilized to connect to the first semiconductor chip 11. This bond part 125 contains a base section 125A, and a cover section 125B to cover the base section 125A.

The base section 125A extends to the wiring layer 126. The base section 125A is bent along its entire surface to form an arc at the tips.

The base section 125A contains no canopy or cover extending roughly parallel to the substrate surface of semiconductor substrate 122. This base section 125A is a structure containing for example any of copper (Cu), nickel (Ni), gold (Au), and palladium (Pd).

The cover section 125B is formed of material with a melting point lower than that for the base section 125A, and covers the entire tip surface of the base section 125A.

This cover section 125B is bent in roughly an arc-shaped surface, formed along the tip surface of the base section 125A.

The cover section 125B is thickest at the tip of the base section 125A. Starting from the tip surface edges of the base section 125A, the cover section 125B becomes thicker towards the tip surface of the base section 125A.

The material forming the cover section 125B is solder. The solder for the cover section 125B may for example be lead-free solder (for example, tin silver solder, tin bismuth solder, tin zinc solder, etc.). The cover section 125B content may include lead such as Sn/95Pb or Sn/63Pb, or may utilize tin (Sn). Solder containing indium (In) may also be used.

The load head H shown in FIG. 1A, conveys the second semiconductor chip 12 on the first semiconductor chip 11, and positions the bond part 111 of the first semiconductor chip 11 to face (opposite) the bond part 125 of the second semiconductor chip 12. The load head H holds the second semiconductor chip 12 by suctioning the second semiconductor chip 12 surface.

The first semiconductor chip 11 is at this time mounted on the heating stage T, and the semiconductor chip 11 reaches a heated state. The second semiconductor chip 12 is also heated by the load head H. The bond part 111 of the first semiconductor chip 11 and the bond part 125 of the second semiconductor chip 12 at this time reach the specified temperature and preferably a temperature below the melting point of the cover section 125B.

Then, as shown in FIG. 1B, the load head H is made to lower to the first semiconductor chip 11 side to make the bond part 111 of the first semiconductor chip 11 directly contact the bond part 125 of the second semiconductor chip 12.

The load head H and the heating stage T at this time enclose and apply pressure to the first semiconductor chip 11 and the second semiconductor chip 12. The first semiconductor chip 11 and the second semiconductor chip 12 attain a state where clamped in their relative positions. The natural oxide film on the surface of the cover section 125B is destroyed by the gripping pressure on the first semiconductor chip 11 and the second semiconductor chip 12 to form a solid-phase diffusion layer 10A at the boundary with the bond part 111 and the cover section 125B. The bond part 111 and the bond part 125 are temporarily clamped in this way.

The solid-phase diffusion layer 10A here is an alloy layer formed by diffusing the metal atoms from one side to the other while the cover section 125 and the bond part 111 are in a solid phase state, or is formed by mutually diffusing the metal atoms.

The suction of the second semiconductor chip 12 by the load head H is next released, and the load head H separates from the second semiconductor chip 12, and the pressure applied to the first semiconductor chip 11 and the second semiconductor chip 12 is also released.

The load head H then conveys the third semiconductor chip 13 serving as the third electronic component onto the semiconductor chip 12 (See FIG. 2). The third semiconductor chip 13 contains a semiconductor substrate 132, a wiring layer 126 formed on this semiconductor substrate 132, and a bond part 125. There are no via holes formed on the semiconductor substrate 132.

The bond part 121 of second semiconductor chip 12, and the bond part 125 of the third semiconductor chip 13 are then temporarily clamped by the same method used for the first semiconductor chip 11 and the second semiconductor chip 12.

More specifically, the load head H conveys the third semiconductor chip 13 onto the second semiconductor chip 12. The bond part 121 of the second semiconductor chip 12 is in this way positioned opposite the bond part 125 of third semiconductor chip 13.

The first semiconductor chip 11 and the second semiconductor chip 12 are at this time mounted on the heating stage T. The first semiconductor chip 11 and the second semiconductor chip 12 reach a heated state. The third semiconductor chip 13 is also heated by the load head H. The bond part 125 of the third semiconductor chip 13 and the bond part 121 of the second semiconductor chip 12 at this time reach a specified temperature and preferably a temperature below the melting point of the cover section 125B.

The load head H is then lowered to the second semiconductor chip 12 side to make the bond part 121 of the first semiconductor chip 12 directly contact the bond part 125 of the third semiconductor chip 13.

The load head H and the heating stage T at this time enclose and apply pressure to the second semiconductor chip 12 and the third semiconductor chip 13. The natural oxide film on the surface of the cover section 125B is destroyed by the gripping pressure on the second semiconductor chip 12 and the third semiconductor chip 13 to form a solid-phase diffusion layer 10A at the boundary with the bond part 121 and the cover section 125B. The bond part 121 and the bond part 125 are temporarily clamped in this way.

The first semiconductor chip 11, the second semiconductor chip 12, and the third semiconductor chip 13 are temporarily clamped in this way.

The suction of the third semiconductor chip 13 by the load head H is next released, and the pressure applied to the first semiconductor chip 11, the second semiconductor chip 12, and the third semiconductor chip 13 is also released.

The process described above is the first process. This first process is performed while exposed to air.

The laminated piece including the temporarily clamped first semiconductor chip 11, the second semiconductor chip 12, and the third semiconductor chip 13 is then placed within the bonding chamber not shown in the drawing. The first semiconductor chip 11, the second semiconductor chip 12, and the third semiconductor chip 13 are cooled while being conveyed to the bonding chamber.

The interior of the bonding chamber attains a vacuum or an atmosphere under a non-oxidizing gas. This non-oxidizing gas is N2 (nitrogen) gas, inert gas, or deoxidizer (reducer) gas. Hydrogen gas or formic acid gas may be used as the deoxidizer (reducer) gas.

As shown in FIG. 3, a pair of press heaters (clamping members) P are mounted opposite each other within this bonding chamber. The laminated piece including the first semiconductor chip 11, the second semiconductor chip 12, and the third semiconductor chip 13 is then mounted on one of the press heaters P.

The pair of press heaters P then applies pressure to clamp the laminated piece including the first semiconductor chip 11, the second semiconductor chip 12, and the third semiconductor chip 13. The size of the flat surface of the press heaters P is larger than the flat surface of the semiconductor chips 11 to 13, and is a size large enough to completely cover the semiconductor chips 11 to 13.

The press heaters P are for example a flat metallic plate.

A cushioning material may be installed between the press heater P and the third semiconductor chip 13.

The press heater P heated to a specified temperature (for example a temperature higher than the cover section 125B melting point), applies pressure to the laminated piece and maintains the heating in this state for a predetermined time.

Alternatively, the press heater P may heat the laminated piece to a specified temperature (for example a temperature higher than the cover section 125B melting point) after applying pressure to the laminated piece, and maintain the heating in this state for a specified period of time.

At this time, the pressure applied by the press heater P (clamping member) to the laminated piece clamps the relative positions of the first semiconductor chip 11 and the second semiconductor chip 12, and also clamps the relative positions of the second semiconductor chip 12 and the third semiconductor chip 13. In other words, the press heater P clamps the mutual relative positions of the first semiconductor chip 11, the second semiconductor chip 12, and the third semiconductor chip 13.

The heat maintaining time (time in which the press heater P applies pressure and maintains heat) is longer than the heat maintaining time when temporarily clamping the first semiconductor chip 11 and the second semiconductor chip 12, and is longer than the heat maintaining time when temporarily clamping the second semiconductor chip 12, and the third semiconductor chip 13 in the first process.

The cover section 125B melts at this time and the metal atoms of the base section 125A diffuse into the cover section 125B, to form an alloy layer 10B respectively between the base section 125A and bond part 111; and between the base section 125A and bond part 121. This alloy layer 10B possesses a higher melting point than the cover section 125B.

The first semiconductor chip 11, the second semiconductor chip 12, and the third semiconductor chip 13 are in this way connected by a strong joint and the manufacture of the electronic device is now completed.

The process described above is the second process.

The effect rendered by this embodiment is described next.

In the above embodiment, the heat maintaining time in the second process is longer than the heat maintaining time in the first process (time that the first semiconductor chip 11 and second semiconductor chip 12, or the first semiconductor chip 11 and second semiconductor chip 12 and the third semiconductor chip 13 that reached a specified temperature are pressured and heated by the load head H and the heating stage T). In the first process the first semiconductor chip 11 and second semiconductor chip 12 are heated in a short time, and the first semiconductor chip 11 and second semiconductor chip 12 temporarily clamped. The second semiconductor chip 12 and third semiconductor chip 13 are in the same way heated in a short time, and the second semiconductor chip 12 and third semiconductor chip 13 temporarily clamped.

The first semiconductor chip 11, the second semiconductor chip 12, and the third semiconductor chip 13 can then be securely joined by heating the first semiconductor chip 11, the second semiconductor chip 12, and the third semiconductor chip 13 in the second process for a longer time than in the first process.

Also during the heating in the second process, the press heater P serves as a clamping member to clamp the joined first semiconductor chip 11, the second semiconductor chip 12, and the third semiconductor chip 13.

Applying pressure to the first semiconductor chip 11, the second semiconductor chip 12, and the third semiconductor chip 13 with the press heater P makes warping (curvature) less prone to occur in the semiconductor chips 11 through 13, and also inhibits displacements from occurring in semiconductor chips 11 through 13.

In the second process where heating is performed for a long time, the effects of the heat make it easier for warping (curvature) and displacements to occur but the press heater P serving as the clamping member inhibits warping and displacements from occurring by clamping the first semiconductor chip 11, the second semiconductor chip 12, and the third semiconductor chip 13.

The reliability of the first semiconductor chip 11, the second semiconductor chip 12, and the third semiconductor chip 13 joint (bond) is therefore improved.

In the first process, the heat maintaining time is short, and is shorter than in the second process so the electronic component is not in a state where heat effects (warping, etc.) are likely to occur and the first semiconductor chip 11 and second semiconductor chip 12 can be joined. In this state, an electronic device with high joint reliability can be obtained by implementing the next process which is the second process.

In particular in this embodiment, the heat maintaining temperature in the first process is lower than the heat maintaining temperature of the second process so the first semiconductor chip 11 and second semiconductor chip 12 can be joined in a state where no effects from heat (warping, etc.) will occur.

The same effect is rendered on the second semiconductor chip 12 and the third semiconductor chip 13.

Moreover, in this embodiment, the second semiconductor chip 12 and the third semiconductor chip 13 are temporarily clamped after temporarily clamping the first semiconductor chip 11 and second semiconductor chip 12. The pair of press heaters P then applies pressure overall to the laminated piece containing the first semiconductor chip 11, the second semiconductor chip 12, and the third semiconductor chip 13 to perform the main clamping of the bond parts at one time. The electronic device productivity is therefore improved compared to the case where performing the main clamping after temporarily clamping the first semiconductor chip and second semiconductor chip, and then temporarily clamping the second semiconductor chip and third semiconductor chip, and performing the main clamping.

In this embodiment, a solid-phase diffusion layer 10A is formed in the first process at the boundary between the cover section 125B and the bond part 121, and temporary clamping performed. The joint or bond from this solid-phase diffusion layer 10A possesses a certain amount of mechanical strength so the first semiconductor chip 11, the second semiconductor chip 12, and the third semiconductor chip 13 that are temporarily clamped can be conveyed to the bonding chamber.

By joining the mutual bond parts in this way in the first process, the first and the second process can be implemented under different environments (atmospheres). The first process can be carried out in air, and the second process can be carried out under a vacuum or a non-oxidizing gas (nitrogen gas, inert gas, or deoxidizer (reducer) gas). The reliability of the joint (or bond) between the semiconductor chips is in this way improved.

A joint or bond formed in a short time in the first process by the solid-phase diffusion layer 10A and sufficiently strong enough to withstand conveying is not known in the related art. So one can assume there is no manufacturing method in the related art for temporarily clamping each of multiple semiconductor chips, and then conveying them to the bonding chamber, and performing the main clamping.

Moreover, when stacking the three layers of semiconductor chips 11 through 13 as in this embodiment, if temporary clamping and main (or permanent) clamping are performed for each semiconductor chip layer then heat from the main clamping is applied twice to the lower layer first semiconductor chip 11 and second semiconductor chip 12. So the first semiconductor chip 11 and the second semiconductor chip 12 are greatly subjected to thermal (or heat) effects.

If temporary and main clamping were performed for example at each layer of the semiconductor chip, then the first semiconductor chip 11 and the second semiconductor chip 12 are greatly subjected to effects from heat so that aligning the positions of bond part 125 of third semiconductor chip 13 and bond part 121 of the second semiconductor chip 12 becomes difficult and the bond parts are joined in a deviated state so that the reliability of the joint might deteriorate.

In contrast, in the present embodiment, effects from heat on the lower layer first semiconductor chip 11 and second semiconductor chip 12 are held to a minimum since the main clamping of the semiconductor chips 11 through semiconductor chip 13 is performed one time after temporarily clamping the first semiconductor chip 11 through third semiconductor chip 13. The bond part 125 of third semiconductor chip 13 and the bond part 121 of the second semiconductor chip 121 are in this way securely joined (bonded) and the reliability of the joint is improved.

Further, in this embodiment the second process is implemented under a vacuum or under a non-oxidizing gas environment. Oxidizing of the bond parts 111, 121, 125 can be prevented by carrying out the second process which requires maintaining the heating for a long time, under a vacuum or under a non-oxidizing gas environment.

In this embodiment, the bond parts 121, 125 are mutually joined, and the bond parts 111, 125 are mutually joined by a metal joint in the first process and the second process. When joining bond parts together with flux as in JP-A No. 79685-2004, the bonding force is extremely weak so displacements tend to easily occur between the bond parts. However in the present embodiment the bond parts 111, 125 are mutually joined, and the bond parts 121, 125 are mutually joined via a metallic joint (or bond) so that displacements are prevented from occurring.

Moreover, the present embodiment does not use flux so no cleaning away of the flux is required so that time and trouble is eliminated during production of the electronic device.

Further, in this embodiment the tip surface of the base section 125A of bond part 125 is formed in an arc shape. This arc widens the space between the bond parts 111, 121 joined to the bond part 125, and the periphery of base section 125A. This melted cover section 125B can therefore be retained in the space between the periphery of base section 125A, and the bond parts 111, 121 joined to bond parts 125. The melted cover section 125B can therefore be prevented from adhering to the insulator film 113, 123, and from being squeezed out to other adjacent bond parts 125A.

Forming the cover section 125B thickest at the tip of base section 125A accelerates the large mechanical deformation occurring in the cover section 125B due to the pressure applied during temporary clamping so the oxidized film on the cover section 125B surface and the layers formed by material adhering to the surface of cover section 125B are destroyed and a satisfactory solid-phase diffusion layer 10A can be formed.

Second Embodiment

Figure 4:
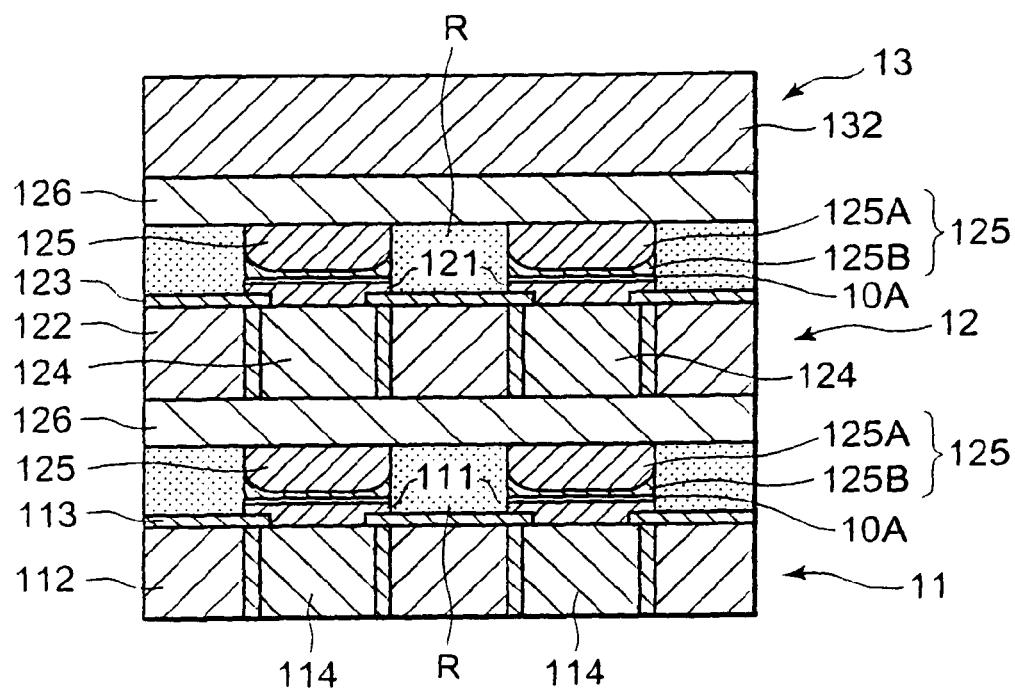
FIG. 4 is a drawing showing the process for manufacturing the electronic device of the second embodiment of this invention.

The second embodiment of this invention is described next while referring to FIG. 4.

In the second process of the above embodiment, the laminated piece including the first semiconductor chip 11 and the second semiconductor chip 12 and the third semiconductor chip 13 are continually heated in a state where the clamping member (press heater P) applies pressure.

In contrast in the second process of this embodiment, resin R is positioned between the respective facing (opposing) surfaces of the first semiconductor chip 11 and the second semiconductor chip 12 and between the respective facing surfaces of the second semiconductor chip 12 and the third semiconductor chip 13 and continually heated.

In the detailed description related next, the first process is implemented by the same method as in the previous embodiment and in all other points is identical to the first embodiment.

The resin R is next injected as a liquid between the facing (opposing) surfaces of the first semiconductor chip 11 and the second semiconductor chip 12. This resin R fills the space between the joined bond parts 111, 125, and between the joined bond parts 121, 125. The resin R fills the gap between the facing surfaces of the first semiconductor chip 11 and the second semiconductor chip 12, and the facing surfaces of the first semiconductor chip 11 and the second semiconductor chip 12 make mutual contact.

The resin R is injected by the same method between the facing surfaces of the second semiconductor chip 12 and the third semiconductor chip 13. This resin R fills the gap between the facing surfaces of the second semiconductor chip 12 and the third semiconductor chip 13, and the facing surfaces of the second semiconductor chip 12 and the third semiconductor chip 13 make mutual contact.

The resin R here is an under-fill material containing for example thermoplastic resin and thermosetting resin. The thermosetting resin may for example be epoxy resin, etc.

The laminated piece including the first semiconductor chip 11, the second semiconductor chip 12 and the third semiconductor chip 13 is then heated to harden the resin R. The hardening temperature of the resin R is for example approximately 150 degrees Celsius. This temperature is lower than the heat maintaining temperature in the first process, and the heat maintaining temperature in the second process. No warping occurs in the first semiconductor chip 11, the second semiconductor chip 12 and the third semiconductor chip 13 at this temperature.

Hardening the resin R make the resin R adhere to the first semiconductor chip 11 and the second semiconductor chip 12, and besides clamping the first semiconductor chip 11, and the second semiconductor chip 12, this resin R also serves as a clamping member for maintaining a specified distance between the (facing) opposing surfaces.

Hardening the resin R not only makes the resin R adhere to the second semiconductor chip 12 and third semiconductor chip 13 but also allows the resin R to serve as a clamping member to clamp the second semiconductor chip 12 and the third semiconductor chip 13 and maintain a specified distance between the opposing (facing) surfaces.

The laminated piece containing the semiconductor chips 11 through 13 is then heated. The laminated piece is inserted for example into a beck furnace or a reflow furnace and heated to maintain a specified temperature (for example a temperature below the melting point of cover section 125B). There is no need here (second embodiment) to apply pressure to the laminated piece as was performed in the previous embodiment.

All other points are identical to the previous embodiment.

During the heating in the second process in this embodiment, the resin R maintains a fixed distance between the opposing surfaces of the joined first semiconductor chip 11 and the second semiconductor chip 12, and between the opposing surfaces of the second semiconductor chip 12 and third semiconductor chip 13. The adhesive force of the resin R prevents warping from occurring in each of the semiconductor chips 11 through 13 since the resin R bonds to each of the opposing surfaces of the first semiconductor chip 11 and the second semiconductor chip 12, and each of the opposing surfaces of the second semiconductor chip 12 and third semiconductor chip 13.

This embodiment is capable of rendering the same effects as the first embodiment.

Third Embodiment

The third embodiment of this invention is described next while referring to FIG. 5.

Figure 5A:
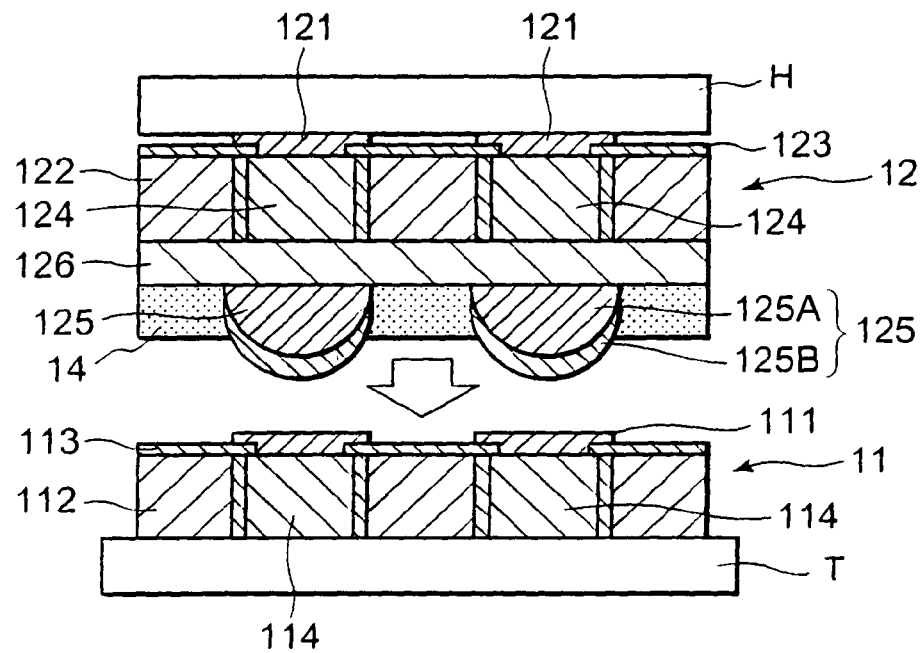
FIG. 5A is a drawing showing the process for manufacturing the electronic device of the third embodiment of this invention.

As shown in FIG. 5A, in the first process in this embodiment, an insulator layer 14 is formed on the periphery of the bond part 125 of second semiconductor chip 12. This insulator layer 14 is formed so as to directly contact the surface of wiring layer 126 of second semiconductor chip 12.

The main element of the insulator layer 14 is for example a thermoplastic resin or a thermosetting resin of polyimide, epoxy, or culled resin, etc.

The method for forming the insulator layer 14 may for example be the spin coating method that coats liquid resin to form the insulator layer 14 on the surface opposite the semiconductor chip 11 of semiconductor chip 12 (in other words, wiring layer 126).

The insulator layer 14 is then hardened, and the section of insulator layer 14 covering the bond part 125 is stripped away by etching, etc.

This etching exposes the bond part 125 on the insulator layer 14.

Besides the spin coat method, the methods for forming the insulator layer 14 may include a method that laminates the resin as a film.

If the insulator layer 14 includes light-curing resin, then liquid resin is spin coated or deposited by the laminate method onto the wiring layer 126 of the second semiconductor chip 12 to form the insulator layer 14, and after aligning of the specified pattern mask, light is irradiated onto the insulator layer 14. An insulator layer 14 is in this way formed except over the bond part 125.

The above processes yield even higher productivity when performed while the semiconductor material is in a wafer state prior to the semiconductor chip dicing.

The insulator layer 14 in this embodiment was formed in contact with the bond part 125 but need not always be formed in contact, and a gap may be formed between the insulator layer 14 and the bond part 125.

After forming the insulator layer 14 in this way, the temporary clamping is implemented in the first process the same as in the first embodiment.

Figure 5B:
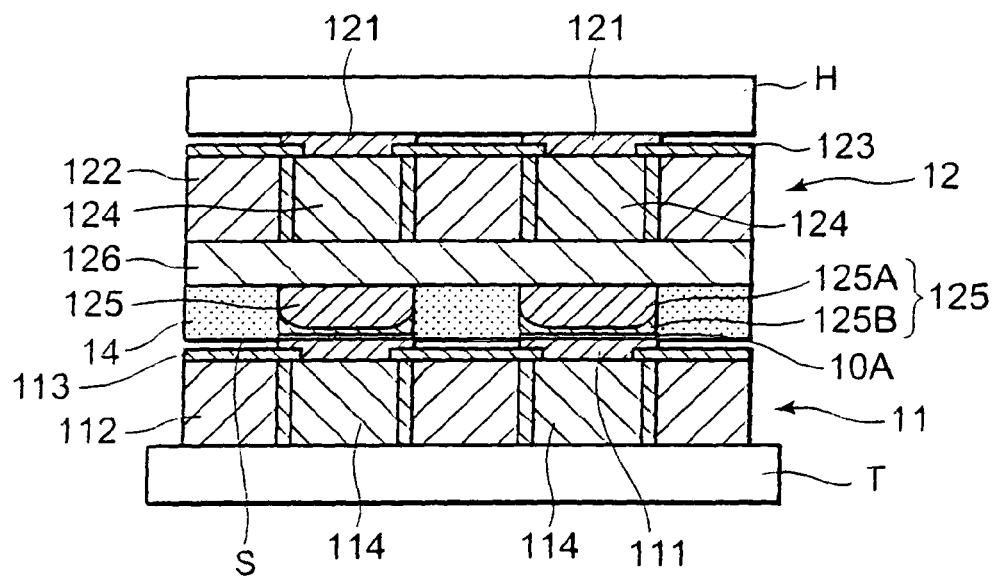
FIG. 5B is a drawing showing the process for manufacturing the electronic device of the third embodiment of this invention.

The insulator layer 14 thickness here is smaller than the bond part 125 height, and is also smaller than the total height of the bond part 125 and the bond part 111. Therefore, in the first process when the bond part 125 is in direct contact with the bond part 111 as shown in FIG. 5B, a gap S is formed between the surface (here, the insulator layer 113) of the first semiconductor chip 11 opposing (facing) the second semiconductor chip 12, and the insulator layer 14.

An insulator layer 14 is also formed by the same method on the periphery of the bond part 125 of the third semiconductor chip 13; and the second semiconductor chip 12, and the third semiconductor chip 13 are temporarily clamped.

Figure 6:
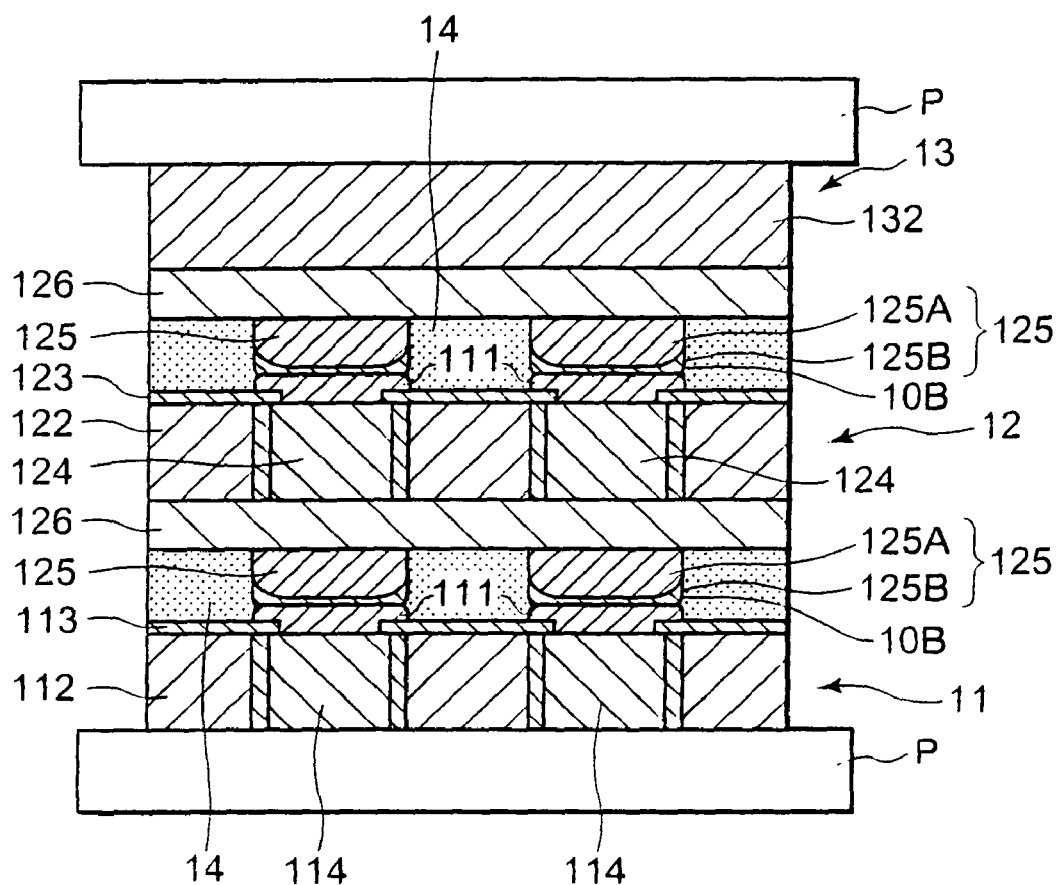
FIG. 6 is a drawing showing the process for manufacturing the electronic device of the third embodiment of this invention.

As shown in FIG. 6, the second process is next implemented by the same method as the first embodiment. In this case, pressure is applied to the laminated piece including the first semiconductor chip 11, the second semiconductor chip 12 and the third semiconductor chip 13 to make the insulator layer 14 and insulator film 113 of first semiconductor chip 11 come in contact and to make the insulator layer 14 and insulator film 123 of second semiconductor chip 12 come in contact.

When the insulator layer 14 contains thermoplastic resin during the heating in the second process, the insulator layer 14 melts and comes in contact with the insulator film 113 of first semiconductor chip 11 or the insulator film 123 of second semiconductor chip 12. The insulator layer 14 then cools while in contact with the insulator film 113 of first semiconductor chip 11 or the insulator film 123 of second semiconductor chip 12 and the insulator layer 14 then hardens.

When the insulator layer 14 contains thermosetting resin, the insulator film fully hardens while in contact with the insulator film 113 of first semiconductor chip 11 or the insulator film 123 of second semiconductor chip 12 and the insulator layer 14 hardens.

The main clamping of the bond part 125 and bond part 111; the main clamping of the bond part 125 and the bond part 121; and the sealing of the bond parts 125, 111, 121 peripheries by the insulator layer 14 are in this way performed simultaneously.

The second process is implemented under a vacuum in this embodiment.

Performing the above processes completes the manufacture of the electronic device.

Besides rendering the same effects as the first embodiment, the present embodiment also renders the following effects.

In the second process of the present embodiment, the main clamping of the bond part 125 and bond part 111; the main clamping of the bond part 125 and the bond part 121; and the sealing of the bond parts 125, 111, 121 peripheries by the insulator layer 14 are performed simultaneously. The productivity when manufacturing the electronic device is therefore improved compared to when the main (or permanent) clamping of the bond parts and sealing by the insulator layer are performed in separate steps.

In the first process performed in air, a gap S is formed between the insulator layer 14, and the semiconductor chips 11, 12 opposite this insulator layer 14; and in the second process performed in a vacuum, the insulator layer 14 and the opposing semiconductor chips 11, 12 come in contact so as to block this gap S.

The air in the gap S is in this way expelled, and air can be prevented from entering when the insulator layer 14 directly contacts the semiconductor chips 11, 12. Since there is no air, voids are prevented from forming within the insulator layer 14.

The insulator layer 14 of this embodiment included thermosetting resin, thermoplastic resin, and light-curing resin, etc. However this invention is not limited to these resins and may also include inorganic insulator films such as silicon oxide films and nitride films, etc. In this case, subjecting the insulator layer 14 to surface treatment such as hydrophilic processing makes the insulator layer easily adhere to the insulator film on the surface of the first semiconductor chip in the second process.

Fourth Embodiment

The fourth embodiment of this invention is described next while referring to FIG. 7 through FIG. 10.

In this embodiment a method for manufacturing semiconductor packages is described.

Figure 7A:
FIG. 7A is a drawing showing the process for manufacturing the electronic device of the fourth embodiment of this invention.

A support piece 41 is first of all prepared as shown in FIG. 7A. This support piece 41 preferably has high resistance to heat and a thermal expansion coefficient near that of the semiconductor chip and may be a substrate made from materials such as a silicon wafer, or glass or ceramic materials, etc.

Figure 7B:
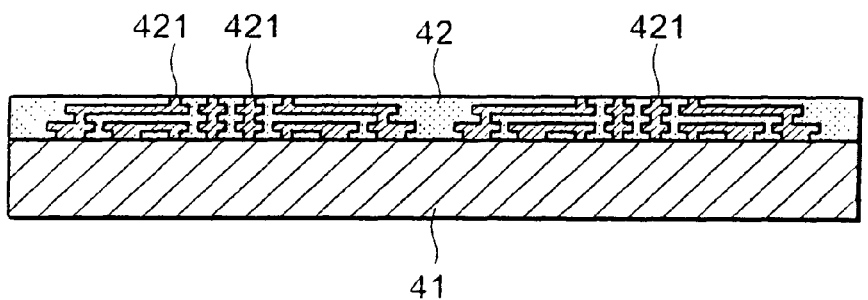
FIG. 7B is a drawing showing the process for manufacturing the electronic device of the fourth embodiment of this invention.

A wiring piece (first electronic component) 42 is next formed on the support piece 41 as shown in FIG. 7B. A built-up layer formed from alternate laminations of insulation layers and wiring layers may for example constitute the wiring piece 42.

The wiring piece 42 is a thin structure. The wiring layer is formed for example from metal such as copper (Cu), nickel (Ni), gold (Au), etc. The insulation layer is preferably formed from a resin with high heat resistance such as polyimide resin or BCB, etc. An epoxy resin may also be utilized as the insulation layer.

There are no particular restrictions on the method for forming the wiring piece 42 and methods such as the semi-additive method, full-additive method, and the subtractive method may be utilized.

A metal bond part 421 is formed on the surface of the wiring piece 42.

Figure 7C:
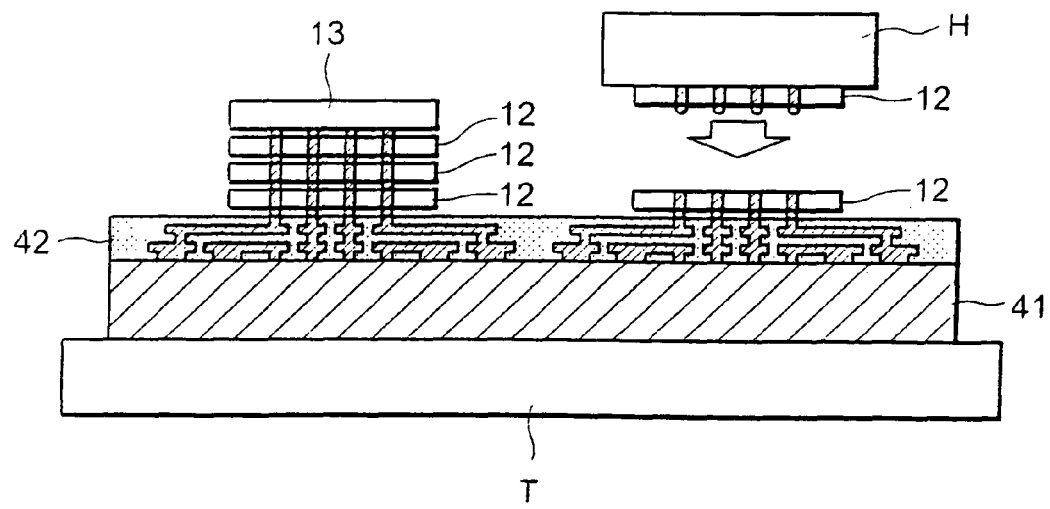
FIG. 7C is a drawing showing the process for manufacturing the electronic device of the fourth embodiment of this invention.

The support piece 41 and the wiring piece 42 are mounted on the heating stage T as shown in FIG. 7C. The second semiconductor chip 12 and the third semiconductor chip 13 are then temporarily clamped to the wiring piece 42 using the same method as in the first process of the first embodiment.

In this embodiment the multiple second semiconductor chips 12 are stacked (laminated), and the third semiconductor chip 13 is mounted on the topmost second semiconductor chip 12.

Also in this embodiment, multiple (for example, two) laminated pieces are formed from the second semiconductor chip 12 and the third semiconductor chip 13 and are mounted adjacently on the surface of the wiring piece 42.

The support piece 41, the wiring piece 42, and multiple laminated pieces made from the second semiconductor chips 12 and the third semiconductor chip 13 mounted on the surface of this wiring piece 42 are placed inside a bonding chamber not shown in the drawing.

Figure 8:
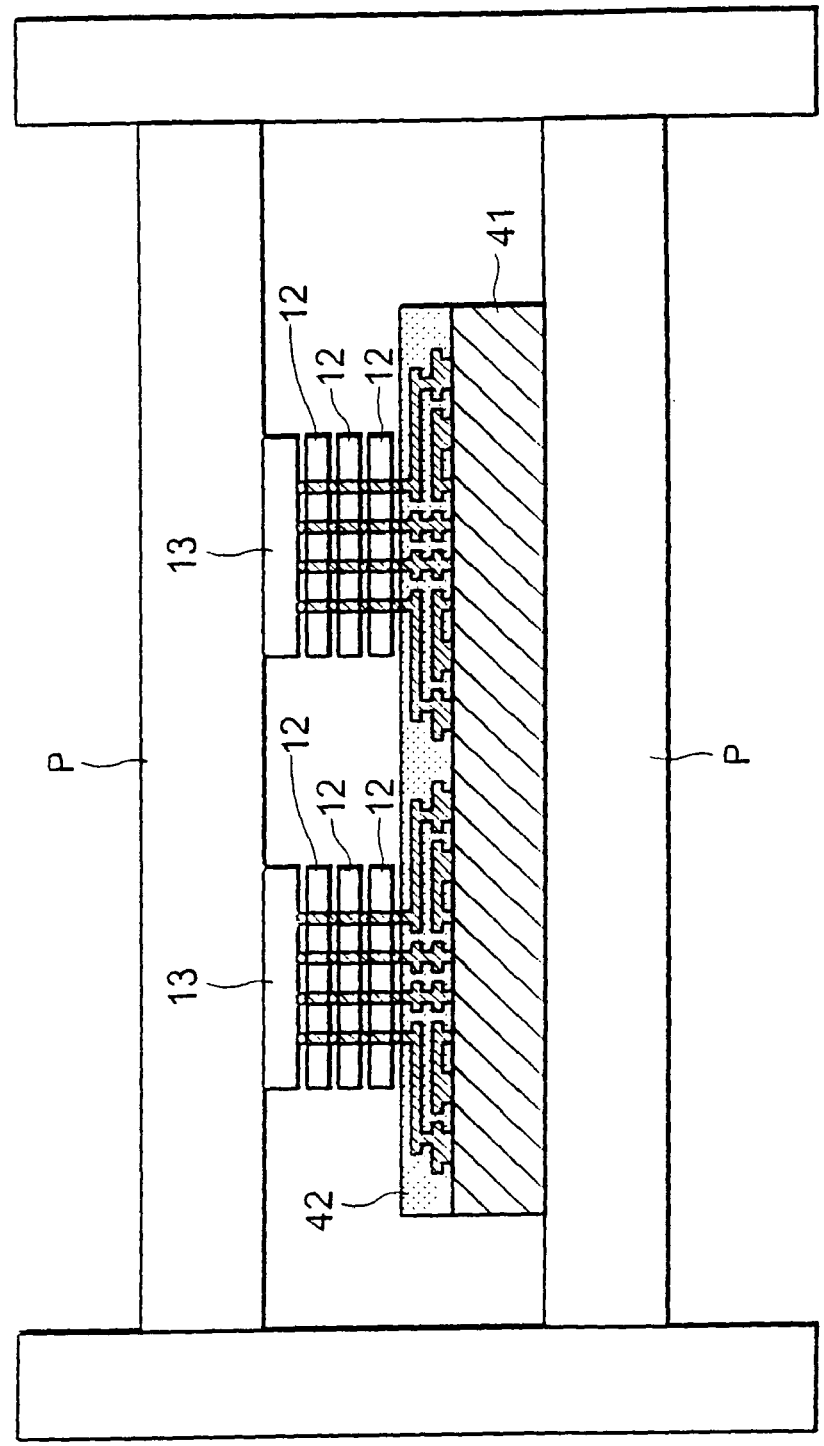
FIG. 8 is a drawing showing the process for manufacturing the electronic device of the fourth embodiment of this invention.

Then as shown in FIG. 8, the press heater P applies pressure to the two laminated pieces made from the wiring piece 42, the second semiconductor chips 12 and the third semiconductor chip 13 using the same method as in the second process in the first embodiment to perform the main clamping.

The press heater P at this time applies pressure to the support piece 41, the wiring piece 42, and the multiple laminated pieces made from the second semiconductor chips 12 and the third semiconductor chip 13, to simultaneously clamp the wiring piece 42, the multiple second semiconductor chips 12 and the third semiconductor chip 13 in their relative positions.

Figure 9:
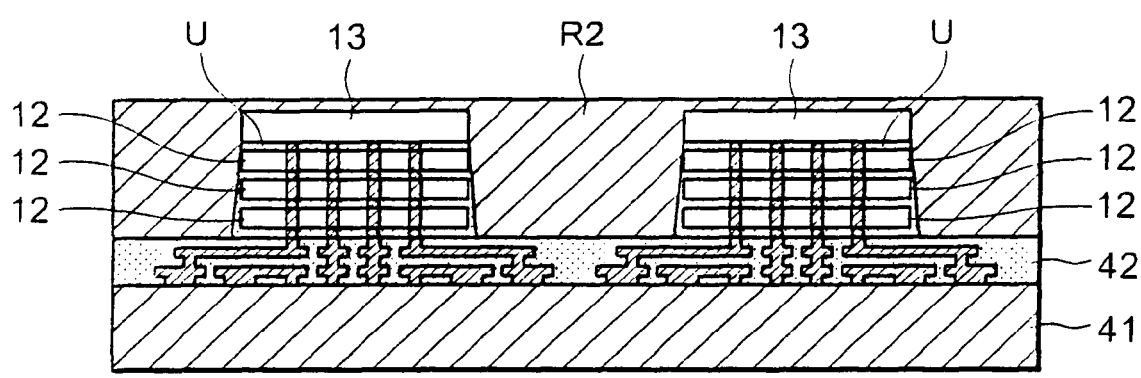
FIG. 9 is a drawing showing the process for manufacturing the electronic device of the fourth embodiment of this invention.

The underfill U is then filled on the periphery of the bond parts as shown in FIG. 9. More specifically, the under-fill U is then filled in the gap between the wiring piece 42 and second semiconductor chip 12, the gap between the second semiconductor chips 12, and the second semiconductor chip 12 and the third semiconductor chip 13.

The laminated piece made from the second semiconductor chips 12 and the third semiconductor chip 13 is then sealed with resin R2

Figure 10:
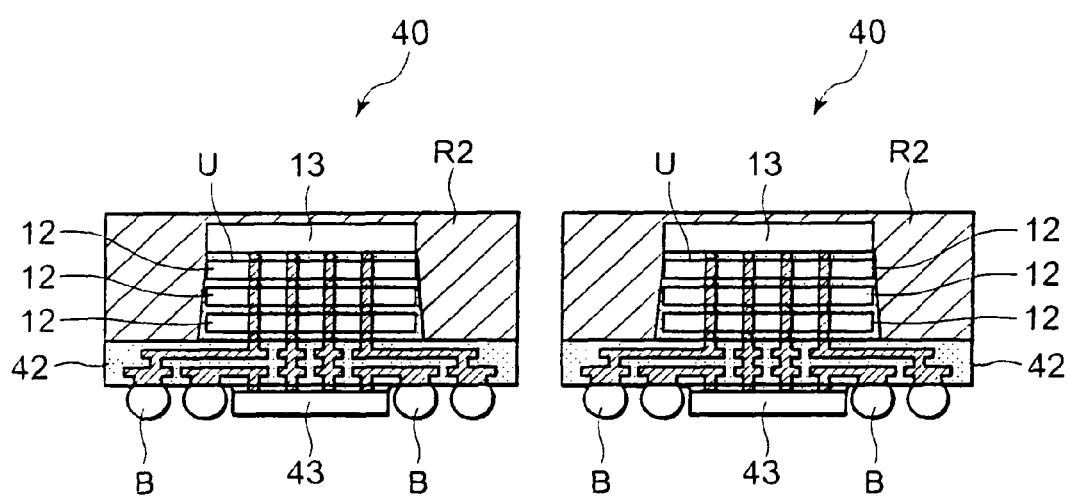
FIG. 10 is a drawing showing the process for manufacturing the electronic device of the fourth embodiment of this invention.

The support piece 41 is then removed to expose the rear surface of the wiring piece 42. The semiconductor chip 43, and the solder ball B are formed on the rear surface of this wiring piece 42 as shown in FIG. 10 and dicing then performed to obtain the semiconductor package 40.

This embodiment renders the same effects as the first embodiment.

In this embodiment, after stacking multiple laminated pieces made from the second semiconductor chip 12 and the third semiconductor chip 13 onto the wiring piece 42, pressure is applied to the wiring piece 42 and laminated piece made from the second semiconductor chip 12 and the third semiconductor chip 13 so the semiconductor package 40 is manufactured with greater productivity.

Moreover, in this embodiment, the first process and the second process are implemented with a wiring piece 42 mounted on the support piece 41 whose heat expansion coefficient is near that of the semiconductor chip.

Warping on the wiring piece 42 caused by a difference in heat expansion coefficients between the semiconductor chip and the support piece 41 can therefore be prevented because heating is performed in a state where the wiring piece 42 is mounted on the support piece 41 whose heat expansion coefficient is close to that of the semiconductor chip.

Lowering the difference between a heat expansion coefficient of the support piece 41 and that of the semiconductor chip definitely prevents poor connections, etc.

This invention is not limited to the above embodiments and includes variations and adaptations within a scope capable of attaining the objects of this invention.

In each of the above embodiments for example, three or more electronic components were laminated in the first process, and temporarily clamped to manufacture an electronic device with three or more laminated electronic components. However the invention is not limited to this number and an electronic device may be manufactured with only two electronic components.

A pair of semiconductor wafers 51 for example may be joined as shown in FIG. 11 to manufacture the semiconductor device.

This wafer 51 is a structure integrating multiple semiconductor chips, and includes a semiconductor substrate 511, and a bond part 512 mounted on the semiconductor substrate 511. This bond part 512 is preferably the same as any of the bond parts 111, 121, and 125 in the above embodiments.

Figure 11A:
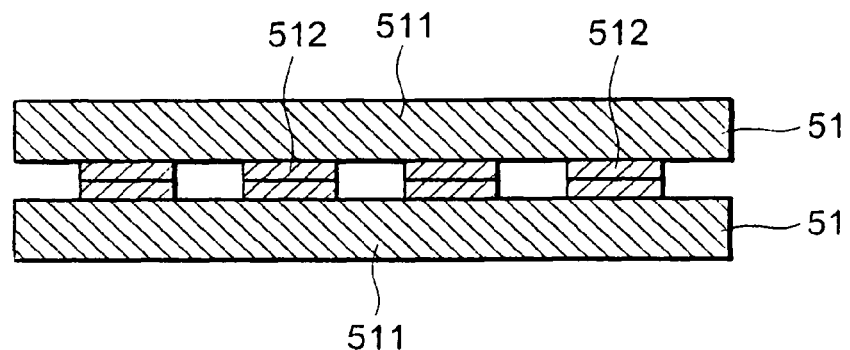
FIG. 11A is a drawing showing the process for manufacturing the electronic device of an adaptation of this invention.

A pair of semiconductor wafers 51 as shown in FIG. 11A are subjected to the first process and temporarily clamped using the same method as in the above embodiments.

Figure 11B:
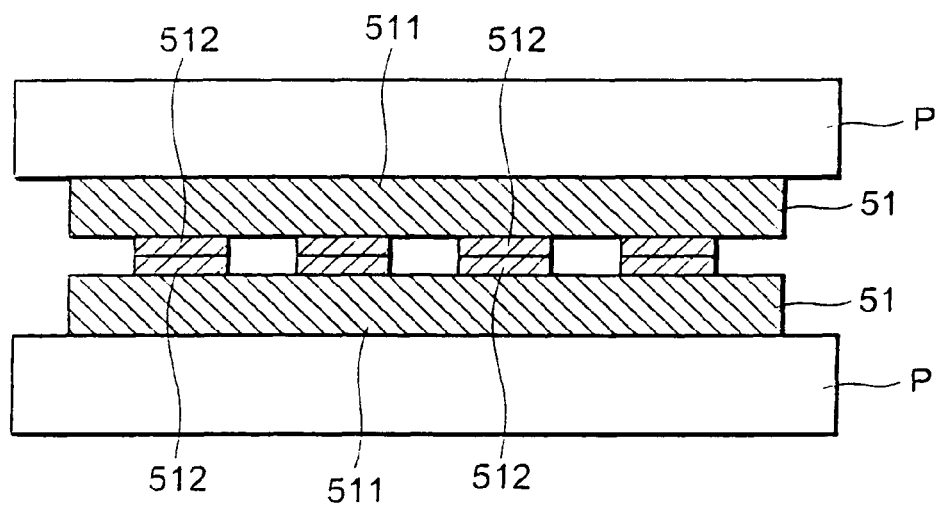
FIG. 11B is a drawing showing the process for manufacturing the electronic device of an adaptation of this invention.

Then in the second process as shown in FIG. 11B, the press heater P clamps the pair of semiconductor wafers 51 maintaining the heat using the same method as in the first embodiment.

In each of the previous embodiments, the bond part 125 including the base section 125A, and the cover section 125B serving as the solder layer and covering this base section 125A was joined to the bond parts 111, 121, etc. However this invention is not limited to this structure and for example the bond part 125 may be a single layer structure the same as the bond parts 111, 121, without a dual layer structure. The bond part 125 may also include metal the same as the bond parts 111, 121.

Moreover heating was performed in the first process in each of the above embodiments to metallically join the bond parts together however heating need not be employed.

It is apparent that the present invention is not limited to the above embodiments, and the embodiments can be modified or changed as appropriate within the scope of the technical concept of the present invention.

What is claimed is:

1. A manufacturing method for an electronic device joining a first metallic bond part formed on a first electronic component and a second metallic bond part formed on a second electronic component, the manufacturing method comprising:
   a first process for:
      placing the first metallic bond part directly against the second metallic bond part;
      applying pressure to the first electronic component and the second electronic component;
      joining the first metallic bond part to the second metallic bond part with solid-phase diffusion; and
      releasing the applied pressure; and
   a second process for:
      heating the first electronic component and the second electronic component at a predetermined temperature such that the first metallic bond part and the second metallic bond part are joined together by melting at least one of the first metallic bond part and the second metallic bond part.

2. The manufacturing method according to claim 1, further comprising:
   forming the first electronic component on a support piece before the first process.

3. The manufacturing method according to claim 2, wherein the support piece has a heat expansion coefficient near a heat expansion coefficient of the second electronic component.

4. The manufacturing method according to claim 2, wherein a heat expansion coefficient of the support piece is the same as a heat expansion coefficient of the second electronic component.

5. The manufacturing method according to claim 2, wherein the support piece and the second electronic component comprise a same material.

6. The manufacturing method according to claim 2, wherein the support piece comprises a substrate comprising a silicon wafer, glass, or ceramic materials.

7. The manufacturing method according to claim 2, wherein the second electronic component comprises a semiconductor chip, the semiconductor chip comprising a through-silicon via.

8. The manufacturing method according to claim 2, wherein the second electronic component comprises a plurality of semiconductor chips, the semiconductor chips being stacked on each other, and
   wherein each of the semiconductor chips comprises a through-silicon via.

9. The manufacturing method according to claim 8, wherein said through-silicon via is connected to through-silicon vias of other semiconductor chips.

10. The manufacturing method according to claim 2, further comprising:
    mounting the first electronic component and the support piece on a heating stage.

11. The manufacturing method according to claim 1, further comprising:
    clamping the second electronic component to the first electronic component, prior to said applying pressure.

12. The manufacturing method according to claim 1, wherein the first electronic component comprises a wiring piece comprising alternate laminations of insulating layers and wiring layers.

13. The manufacturing method according to claim 1, wherein the first metallic bond part is formed on a surface of the first electronic component.

14. The manufacturing method according to claim 1, further comprising:
    mounting a plurality of laminated pieces of the second electronic component adjacently on a surface of the first electronic component.

15. The manufacturing method according to claim 14, further comprising:
    press heating said plurality of laminated pieces of the second electronic component mounted on the surface of the first electronic component.

16. The manufacturing method according to claim 15, wherein said press heating comprises:
    applying pressure to a support piece of the first electronic component, the first electronic component, and said plurality of laminated pieces, to simultaneously clamp the first electronic component and said plurality of laminated pieces in their relative positions.

17. The manufacturing method according to claim 1, wherein the first electronic component comprises a wiring piece formed on a support piece,
    wherein the second electronic component comprises a semiconductor chip, and
    wherein the method further comprises:
       removing the support piece from the wiring piece after implementing the second process.

18. A manufacturing method for an electronic device joining a first metallic bond part formed on a first electronic component and a second metallic bond part formed on a second electronic component, the manufacturing method comprising:
    a first process for:
       placing the first metallic bond part directly against the second metallic bond part;
       applying pressure to the first electronic component and the second electronic component;
       metallically joining the first metallic bond part to the second metallic bond part; and
       releasing the applied pressure; and
    a second process for:
       heating the first electronic component and second electronic component at a predetermined temperature so that the first metallic bond part and the second metallic bond part are joined to each other,
    wherein the first electronic component or the second electronic component includes a semiconductor substrate and, the second metallic bond part mounted on the semiconductor substrate,
    wherein the second metallic bond part includes a base section and a cover section covering a surface of the base section with a melting point lower than that of the base section,
    wherein in the first process, the first electronic component and the second electronic component are heated and maintained at a temperature lower than the melting point of the cover section, and
    wherein in the second process, the first electronic component and the second electronic component are heated and maintained at a temperature higher than the melting point of the cover section.

19. The manufacturing method for the electronic device according to claim 18, wherein the base section is affixed on the semiconductor substrate.

20. The manufacturing method for the electronic device according to claim 18, wherein in the second process, metal atoms that make up the base section diffuse into the cover section.

21. The manufacturing method for the electronic device according to claim 18, wherein the cover section comprises tin (Sn) or indium (In), and wherein the base section includes any of copper (Cu), nickel (Ni), gold (Au), or palladium (Pd).

22. The manufacturing method for the electronic device according to claim 18, wherein the base section is bent to form an arc at tip surfaces.

23. The manufacturing method for the electronic device according to claim 18, further comprising:

forming the first electronic component on a support piece before the first process.

24. The manufacturing method for the electronic device according to claim 23, wherein the second electronic component comprises a semiconductor chip, the semiconductor chip comprising a through-silicon via.

25. The manufacturing method for the electronic device according to claim 23, wherein the second electronic component comprises a plurality of semiconductor chips, the semiconductor chips being stacked on each other, and wherein each of the semiconductor chips comprises a through-silicon via.

26. The manufacturing method for the electronic device according to claim 25, wherein said through-silicon via is connected to through-silicon vias of other semiconductor chips.

27. The manufacturing method for the electronic device according to claim 18, wherein the first electronic component comprises a wiring piece formed on a support piece, wherein the second electronic component comprises a semiconductor chip, and wherein the method further comprises:

removing the support piece from the wiring piece after implementing the second process.

\* \* \* \* \*